(12) United States Patent
Lehtola

(10) Patent No.: US 11,264,958 B2
(45) Date of Patent: Mar. 1, 2022

(54) PARALLEL CASCODE AMPLIFIER FOR ENHANCED LOW-POWER MODE EFFICIENCY

(71) Applicant: SKYWORKS SOLUTIONS, INC., Woburn, MA (US)

(72) Inventor: Philip John Lehtola, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 152 days.

(21) Appl. No.: 16/586,723

(22) Filed: Sep. 27, 2019

(65) Prior Publication Data

US 2020/0106405 A1   Apr. 2, 2020

Related U.S. Application Data

(60) Provisional application No. 62/738,987, filed on Sep. 28, 2018.

(51) Int. Cl.
*H03F 3/68* (2006.01)
*H03F 3/213* (2006.01)
*H03F 1/02* (2006.01)

(52) U.S. Cl.
CPC .......... *H03F 3/213* (2013.01); *H03F 1/0205* (2013.01); *H03F 2200/222* (2013.01); *H03F 2200/249* (2013.01); *H03F 2200/451* (2013.01)

(58) Field of Classification Search
CPC .. H03F 3/213; H03F 1/0205; H03F 2200/222; H03F 2200/451; H03F 2200/249
USPC ................................ 330/51, 296, 302, 305
See application file for complete search history.

(56) References Cited

U.S. PATENT DOCUMENTS

| | | | |
|---|---|---|---|
| 6,204,728 B1 * | 3/2001 | Hageraats | H03F 1/34 330/98 |
| 7,642,859 B2 * | 1/2010 | Shimada | H03F 3/189 330/302 |
| 2006/0164163 A1 * | 7/2006 | Apel | H03F 3/72 330/151 |

* cited by examiner

*Primary Examiner* — Khanh V Nguyen
*Assistant Examiner* — Khiem D Nguyen
(74) *Attorney, Agent, or Firm* — Change & Hale LLP

(57) ABSTRACT

In some embodiments, a power amplification system can comprise a current source, an input switch configured to alternatively feed current from the current source to a high-power circuit path and a low-power circuit path, and a band switch including a switch arm for switching between a plurality of bands. Each of the high-power circuit path and the low-power circuit path can be connected to the switch arm.

14 Claims, 7 Drawing Sheets

PARALLEL CASCODE AMPLIFIER FOR ENHANCED LOW-POWER MODE EFFICIENCY

CROSS-REFERENCE TO RELATED APPLICATION(S)

This application claims priority to U.S. Provisional Application No. 62/738,987 filed Sep. 28, 2018, entitled PARALLEL CASCODE AMPLIFIER FOR ENHANCED LOW-POWER MODE EFFICIENCY, the disclosure of which is hereby expressly incorporated by reference herein in its respective entirety.

BACKGROUND

Field

The present disclosure relates to power amplifier circuits, related devices, and related methods.

Description of the Related Art

A power amplifier is generally designed to provide maximum efficiency at the maximum rated output power for the amplifier. The maximum output power for some third generation and/or fourth generation (3G/4G) amplifier systems is approximately 25 decibel-milliwatts (dBm) antenna power.

SUMMARY

In accordance with some implementations, the present disclosure relates to a power amplification system comprising a current source, an input switch configured to alternatively feed current from the current source to a high-power circuit path and a low-power circuit path, and a band switch including a switch arm for switching between a plurality of bands. Each of the high-power circuit path and the low-power circuit path are connected to the switch arm.

In some embodiments, the low-power circuit path can include a first transistor and a second transistor. The first transistor can include a first collector, a first emitter, and a first base. The second transistor can include a second collector, a second emitter, and a second base. In some embodiments, the first emitter can be connected to the second collector. In some embodiments, the first transistor can be a common-base transistor and the second transistor is a common-emitter transistor. In some embodiments, the second base can be connected to the input switch.

In some embodiments, the high-power circuit path can include a third transistor and a fourth transistor. The third transistor can include a third collector, a third emitter, and a third base. The fourth transistor can include a fourth collector, a fourth emitter, and a fourth base. In some embodiments, each of the first collector and the third collector can be connected to the switch arm. In some embodiments, the first collector can be connected to the third collector at a node. The node can be connected to the switch arm.

In some embodiments, the third emitter can be connected to the fourth collector. In some embodiments, the third transistor can be a common-base transistor and the fourth transistor can be a common-emitter transistor. In some embodiments, the fourth base can be connected to the input switch.

In some teachings, the present disclosure relates to a method comprising alternatively providing current, at an input switch, from a current source to a high-power circuit path or a low-power circuit path and switching a switch arm of a band switch between a plurality of bands based on the current provided to the high-power circuit path or the low-power circuit path. Each of the high-power circuit path and the low-power circuit path is connected to the switch arm.

In some embodiments, the low-power circuit path can include a first transistor and a second transistor. The first transistor can include a first collector, a first emitter, and a first base. The second transistor can include a second collector, a second emitter, and a second base. In some embodiments, the first emitter can be connected to the second collector. In some embodiments, the first transistor can be a common-base transistor and the second transistor can be a common-emitter transistor. In some embodiments, the second base can be connected to the input switch.

In some embodiments, the high-power circuit path can include a third transistor and a fourth transistor. The third transistor can include a third collector, a third emitter, and a third base. The fourth transistor can include a fourth collector, a fourth emitter, and a fourth base. In some embodiments, each of the first collector and the third collector can be connected to the switch arm. In some embodiments, the first collector can be connected to the third collector at a node. The node can be connected to the switch arm.

In some embodiments, the third emitter can be connected to the fourth collector. In some embodiments, the third transistor can be a common-base transistor and the fourth transistor can be a common-emitter transistor. In some embodiments, the fourth base can be connected to the input switch.

In a number of implementations, the present disclosure relates to a circuit comprising a current source, an input switch configured to alternatively feed current from the current source to a high-power circuit path and a low-power circuit path, and a band switch including a switch arm for switching between a plurality of bands. Each of the high-power circuit path and the low-power circuit path are connected to the switch arm.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DESCRIPTION

Figure 1:
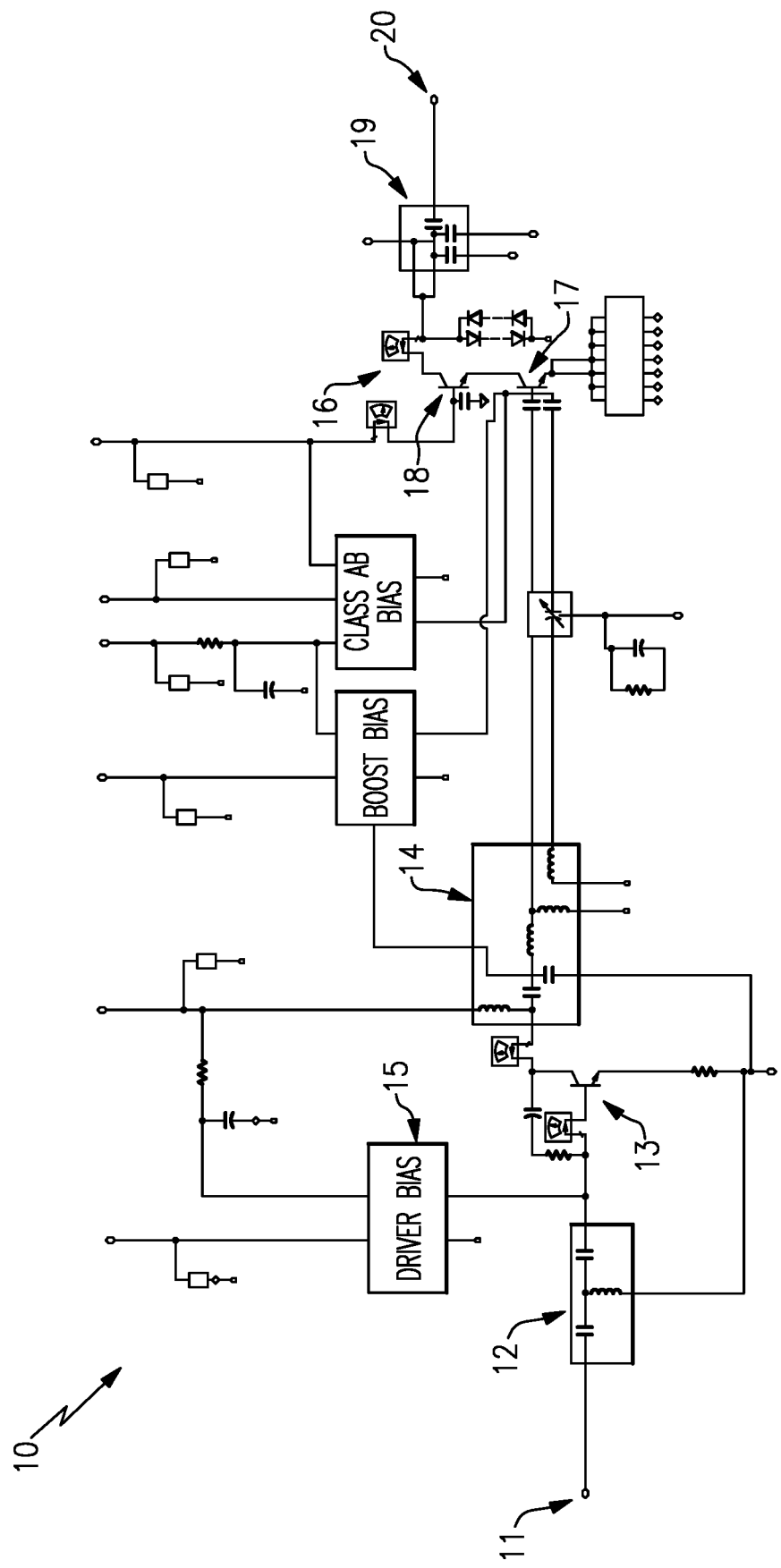
FIG. 1 shows a power amplifier including a high-power mode stage, in accordance with some embodiments.

The headings provided herein, if any, are for convenience only and do not necessarily affect the scope or meaning of the claimed invention.

A power amplifier is generally designed to provide maximum efficiency at the maximum rated output power for the amplifier. The maximum output power for some third generation and/or fourth generation (3G/4G) amplifier systems is approximately 25 decibel-milliwatts (dBm) antenna power. However, some power amplifiers that are configured to operate efficiently at high power levels may be inefficient when operating at low power levels (e.g., at 0 dBm antenna power). For example, specifications of the power amplifier, including the number of stages, amplifier transistor sizes, and/or bias networks, may be chosen to optimize performance at high power levels (e.g., 25 dBm), leading to significant efficiency tradeoffs when operating at a lower power (e.g., 0 dBm).

Some power amplifiers (including some 3G/4G handset amplifiers) have multiple gain stages to achieve a desired amount of gain between the transceiver and antenna at the highest output power. To reduce the dynamic range requirement of the transceiver, it is desirable to have significantly reduced gain at lower output powers. For example, for some power amplifiers it is desirable to have 25-30 dB gain at high power and 10-15 dB gain at low power. It is also desirable to maintain efficient current consumption at low output power levels with lower gain. However, 10-15 dB gain at low power can be difficult to achieve on a multi-stage power amplifier designed for 25-30 dB gain at high power.

One option for improving efficiency and lower gain at low output power levels involves reducing bias current within the power amplifier. For example, quiescent current levels may be reduced as much as possible to support a lower output power. However, reducing bias current can lead to degraded linearity of the power amplifier. Generally, the lower the current that a power amplifier is operated at, the worse the linearity of the power amplifier. Moreover, particularly for power amplifiers having multiple gain stages, lowering bias current may be ineffective for lowering the gain of the power amplifier. Accordingly, solutions involving lowering bias current may also require incorporating attenuation at the power amplifier in order to effectively reduce the gain, and attenuation may cause performance issues for the power amplifier.

Some embodiments described herein provide enhanced high-power mode (HPM) and/or low-power mode (LPM) efficiency through use of cascode HPM and/or LPM stages. In some embodiments, each of a HPM stage and a LPM stage may connect to a single switch arm at a band switch. Some embodiments involve connecting the switch arm to parallel HPM cascode and LPM cascodes. In this way, the number of switch arms at the band switch is minimized and the size of the power amplifier may be limited to allow efficient current consumption at low output power levels with lower gain.

FIG. 1 shows a power amplifier including a HPM stage, in accordance with some embodiments. In the embodiment shown in FIG. 1, the amplifier 10 includes a radio frequency (RF) input 11 that may deliver current to an input matching circuit 12 including two series capacitors and a shunt inductor. A first stage of the power amplifier 10 may include a common-emitter transistor 13 that may be connected to a driver matching circuit 14 between a driver stage and a final stage of the power amplifier 10. The term "connected" is used herein according to its broad and ordinary meaning and may refer to a physical coupling or connection between components of a circuit. A person having ordinary skill in the art will understand that a connection may refer to a connection to a common wire and/or node.

A first bias source 15 may provide a base bias current for the common-emitter transistor 13 driver stage to set the quiescent current. The driver matching circuit 14 may include a supply inductor, a series capacitor, two shunt inductors, and a series inductor. The driver matching circuit 14 may feed into a HPM cascode 16 comprising a common-emitter transistor 17 and a common-base transistor 18. A second bias source 19 may provide a base bias current for the final stage to set the quiescent current. The collector of the common-base transistor 18 may be connected to a capacitor circuit 19 configured to provide harmonic termination to support the class of operation of the power amplifier. An RF output 20 may feed a band switch through matching inductance.

Figure 2:
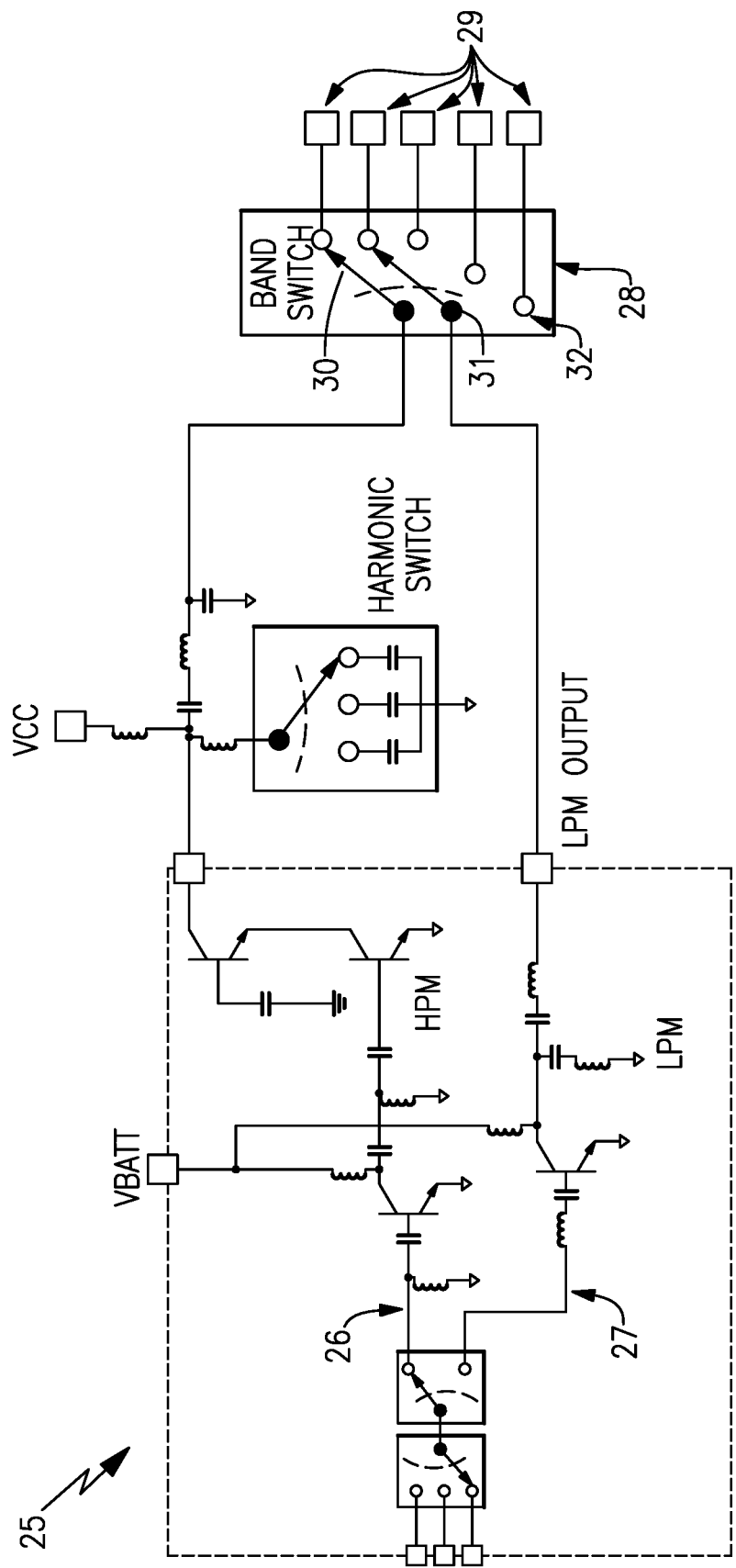
FIG. 2 shows one embodiment of a multi-stage cascode power amplifier having a high-power mode stage and a low-power mode stage, the power amplifier including separate switch arms for each stage in accordance with some embodiments.

FIG. 2 shows one embodiment of a multi-stage cascode power amplifier having a HPM stage and a LPM stage, the power amplifier including separate switch arms for each stage in accordance with some embodiments. The power amplifier 25 may comprise a HPM stage 26 and a LPM stage 27. The HPM stage 26 may be optimized for higher power levels (e.g., 25 dBm) while the LPM stage 27 may be optimized for lower power levels (e.g., 0 dBm). In some embodiments, the LPM stage 27 may be configured to reduce current at low power levels in order to reduce gain. The power amplifier 25 may comprise a band switch 28 for switching between a plurality of bands 29 (e.g., a 3G band, 4G band, etc.). In some embodiments, the HPM stage 26 may have an associated HPM switch arm 30 and the LPM stage 27 may have an associated LPM switch arm 31 at the band switch 28. During high-power modes, the HPM stage 26 may be active while during low-power modes, the LPM stage 27 may be active. In this way, HPM performance and LPM performance can be effectively decoupled to allow for optimization of both modes. However, including multiple switch arms in the band switch 28 may require increased complexity, size, and/or cost of the band switch 28 and/or the power amplifier 25 relative to power amplifiers comprising a single band switch arm.

In some embodiments, the band switch 28 may comprise multiple parallel sets of switch paths 32. For example, if there are two switch arms, there may be a set of switch paths 32 for each switch arm. In the example shown in FIG. 2, there may be ten switch paths; five for the HPM switch arm 30 and five for the LPM switch arm 31. Accordingly, as the number of bands 29 and/or switch arms increases, the size of the band switch 28 can increase exponentially, which can result in drastic increases in size and/or cost of the power amplifier 25.

Figure 3:
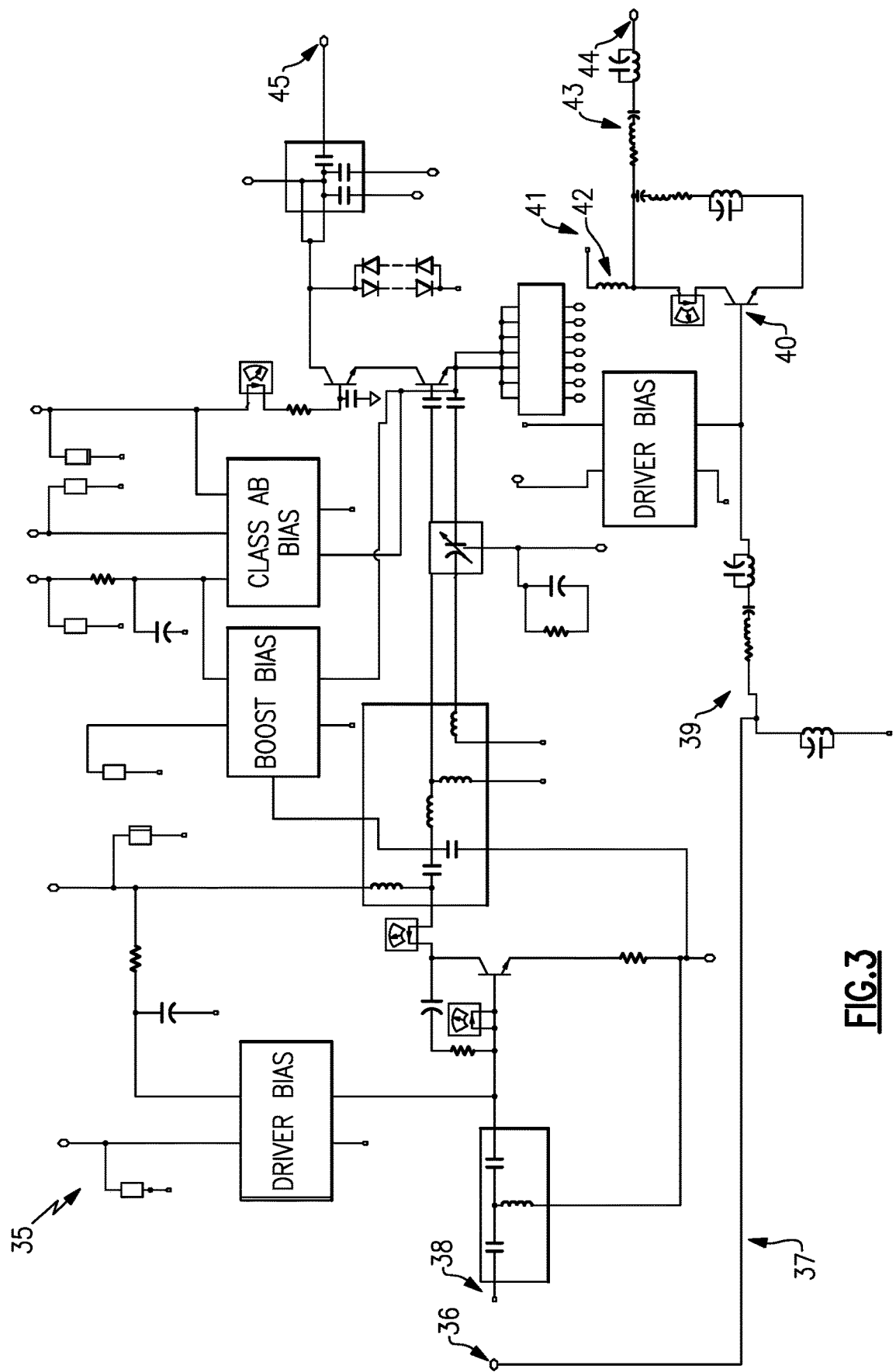
FIG. 3 shows another embodiment of a multi-stage cascode power amplifier having a high-power mode stage and a low-power mode stage, the power amplifier including separate switch arms for each stage in accordance with some embodiments.

FIG. 3 shows another embodiment of a multi-stage cascode power amplifier having a HPM stage and a LPM stage, the power amplifier including separate switch arms for each stage in accordance with some embodiments. The power amplifier 35 may include a RF input 36 which may be fed into a dedicated LPM stage 37. In some embodiments, the power amplifier 35 may include a switch to connect the RF input to the LPM stage 37 and a HPM stage 38. The LPM stage 37 may include an input matching circuit 39 which may feed into a common-emitter transistor 40. The collector of the common-emitter transistor may be connected to a supply voltage 41 via an inductor 42. The common-emitter transistor 40 may feed into a harmonic termination circuit 43 and provide an LPM output 44 to a band switch. The power amplifier 35 may further include HPM output 45 for the HPM stage 38 to the band switch. Accordingly, the band switch for the power amplifier may include separate switch arms for the HPM stage 38 and the LPM stage 37, with one switch arm connected to the LPM output 44 and another switch arm connected to the HPM output 45.

Figure 4:
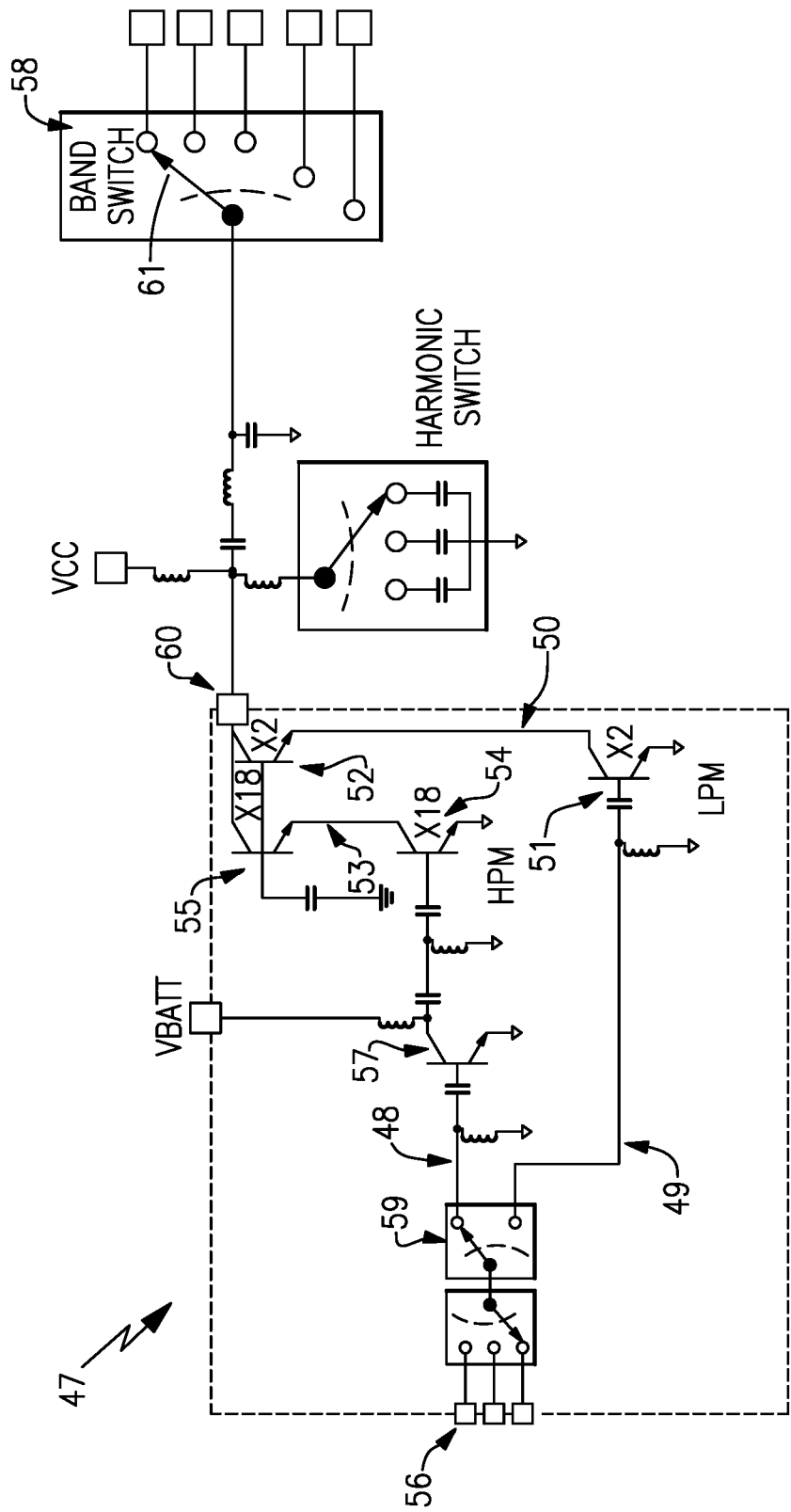
FIG. 4 shows a multi-stage cascode power amplifier for connecting a high-power mode stage and a low-power mode stage to a single band switch arm, in accordance with some embodiments.

FIG. 4 shows a multi-stage cascode power amplifier for connecting a HPM stage and an LPM stage to a single band switch arm, in accordance with some embodiments. The power amplifier 47 may comprise a HPM stage 48 and a LPM stage 49. In some embodiments, the power amplifier 47 may comprise additional stages. The HPM stage 48 may be optimized for high power (e.g., 25 dBm) and the LPM stage 49 may be optimized for low power (e.g., 0-10 dBm). In some embodiments, the power amplifier 47 may comprise an input switch 59 configured to alternatively supply current from an RF input 56 source to the HPM stage 48 or the LPM stage 49.

The LPM stage 49 may include a LPM cascode 50 comprising a first common-emitter transistor 51 and a first common-base transistor 52. In some embodiments, the first common-emitter transistor 51 and the first common-base transistor 52 may be in a cascode configuration, in which the collector of the first common-emitter transistor 51 is connected to the emitter of the first common-base transistor 52.

In some embodiments, the HPM stage 48 includes a HPM cascode 53 comprising a second common-emitter transistor 54 and a second common-base transistor 55. The second common-emitter transistor 54 and the second common-base transistor 55 may be in a cascode configuration in which the collector of the second common-emitter transistor 54 is connected to the emitter of the second common-base transistor 55. In some embodiments, the base of the first common-base transistor 52 and/or the base of the second common-base transistor 55 may be coupled to ground via a capacitor, as shown in FIG. 4.

In some embodiments, the base of the first common-emitter transistor 51 may be connected to the input switch 59 which is connected to the RF input 56. The collector of the first common-base transistor 52 may be connected to the collector of the second common-base transistor 55, for example at a node 60. As shown in FIG. 4, a network of inductors and/or capacitors may be connected between the node 60 and the band switch 58.

The base of the second common-emitter transistor 54 may be connected to a battery voltage source ("VBATT"), the input switch 59, and/or to a collector of a third common-emitter transistor 57. The base of the third common-emitter transistor 57 may be connected to the input switch 59. In some embodiments, each of the first common-emitter transistor 51, the first common-base transistor 52, the second common-emitter transistor 54, the second common-base transistor 55, and the third common-emitter transistor 57 may be any type of transistor, for example a bipolar junction transistor (BJT).

In the LPM configuration, the first common-base transistor 51 may perform the function of a switch so that a designated LPM switch at the band switch 58 is not required. Rather, both of the first common-emitter transistor 52 and the second common-emitter transistor 55 may be connected to a single switch arm 61. In this way, the size, cost, and/or complexity of the power amplifier 47 may be reduced relative to devices having two or more switches at a band switch. Moreover, the LPM stage 49 may provide limited loading at the HPM stage 48 without degrading the HPM stage 48. In some embodiments, the LPM stage 49 may act as a single-stage amplifier. Accordingly, lower gain levels (e.g., 10-15 dB) may be achieved without linearity degradation.

In some embodiments, one or more of the first common-emitter transistor 51, the first common-base transistor 52, the second common-emitter transistor 54, and the second common-base transistor 55 may comprise a plurality of transistors in parallel. For example, each of the first common-emitter transistor 51 and the first common-base transistor 52 may comprise two transistors in parallel while each of the second common-base transistor 55 and the second common-emitter transistor 54 may comprise eighteen transistors in parallel.

Switching between the HPM stage 48 and the LPM stage 49 may be performed at the input switch 59. The input switch 59 may be configured to alternatively supply current to the HPM stage 48 or the LPM stage 49. In some embodiments, the LPM cascode 50 may be activated by switching the input switch 59 such that bias current from the RF input 56 is fed to the LPM stage 49 side. Similarly, the HPM cascode 53 may be activated by switching the input switch 59 such that bias current from the RF input 56 is fed to the HPM stage 48 side. If the first common-emitter transistor 51 is active, bias current may flow through the LPM stage 49. If the second common-emitter transistor 54 is active, bias current may flow through the HPM stage 48. In some embodiments, voltage may be shared between the HPM cascode 53 and the LPM cascode 50.

Figure 5:
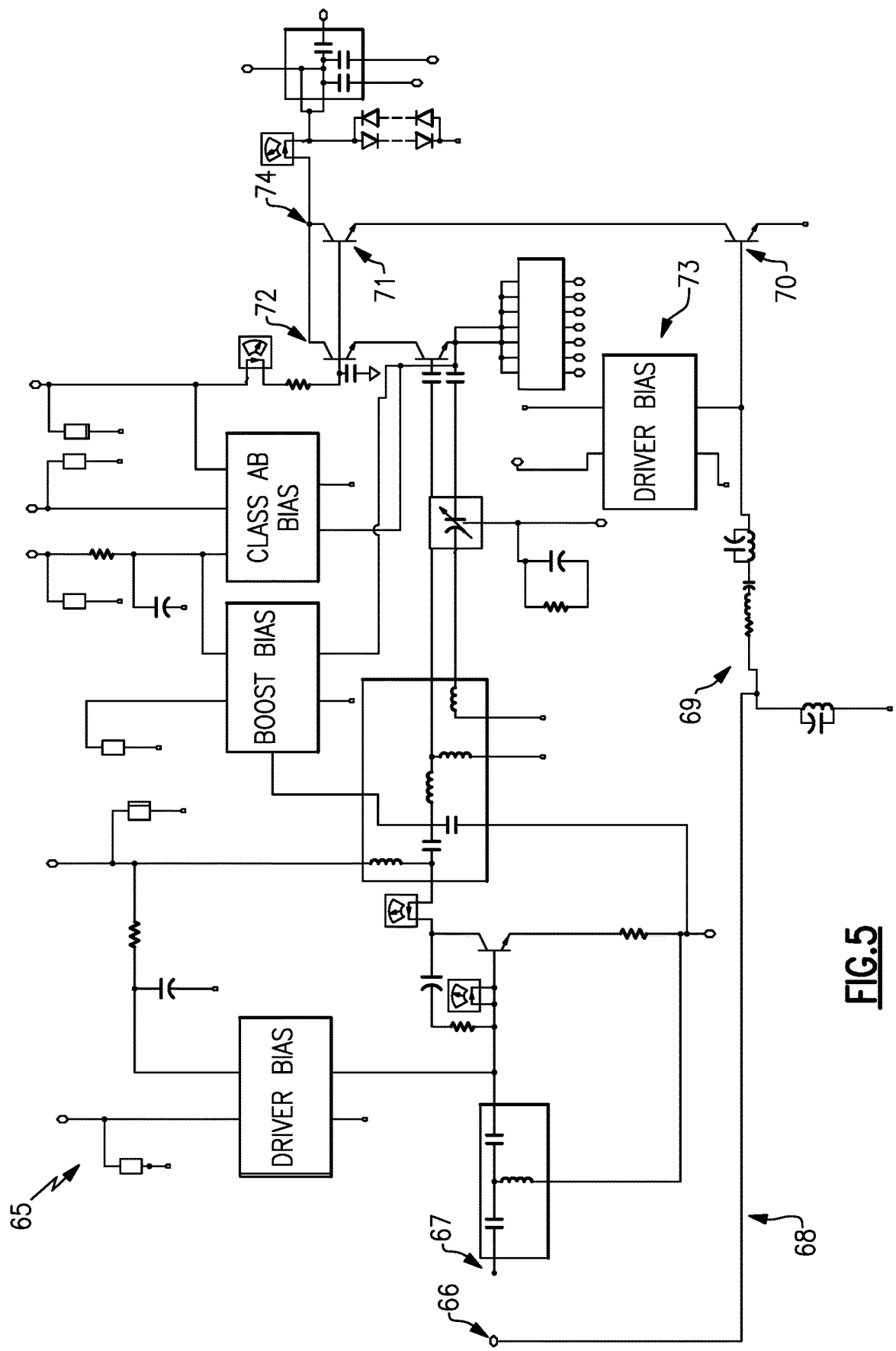
FIG. 5 shows another multi-stage cascode power amplifier for connecting a high-power mode stage and a low-power mode stage to a single band switch arm, in accordance with some embodiments.

FIG. 5 shows another multi-stage cascode power amplifier for connecting a HPM stage and an LPM stage to a single band switch arm, in accordance with some embodiments. The power amplifier 65 comprises an RF input 66 which may be fed alternatively into the HPM stage 67 or the LPM stage 68. The LPM stage may comprise a matching circuit 69 and a common-emitter transistor 70. The collector of the common-emitter transistor may feed into a LPM common-base transistor 71. The base of the LPM common-base transistor 71 may share a node with a HPM common-base transistor 72. By providing a source current to a first bias source 73, the LPM stage 68 may be activated and the common-emitter transistor 70 may conduct collector current, which may in turn activate the LPM common-base transistor 71. When the LPM stage 68 is activated, there may be no current running through the HPM stage 67, resulting in a high isolation stage. Conversely, activating the HPM stage 67 may cause quiescent current to pass through the HPM transistors. In this way, either stage may be selected based on where bias current is applied. Each of the HPM stage 67 and the LPM stage 68 may connect to a common node 74 which may connect to a switch arm at a band switch. Because both stages connect to the same switch arm, only one switch arm may be needed at the band switch for the combined HPM stage 67 and the LPM stage 68.

Figure 6:
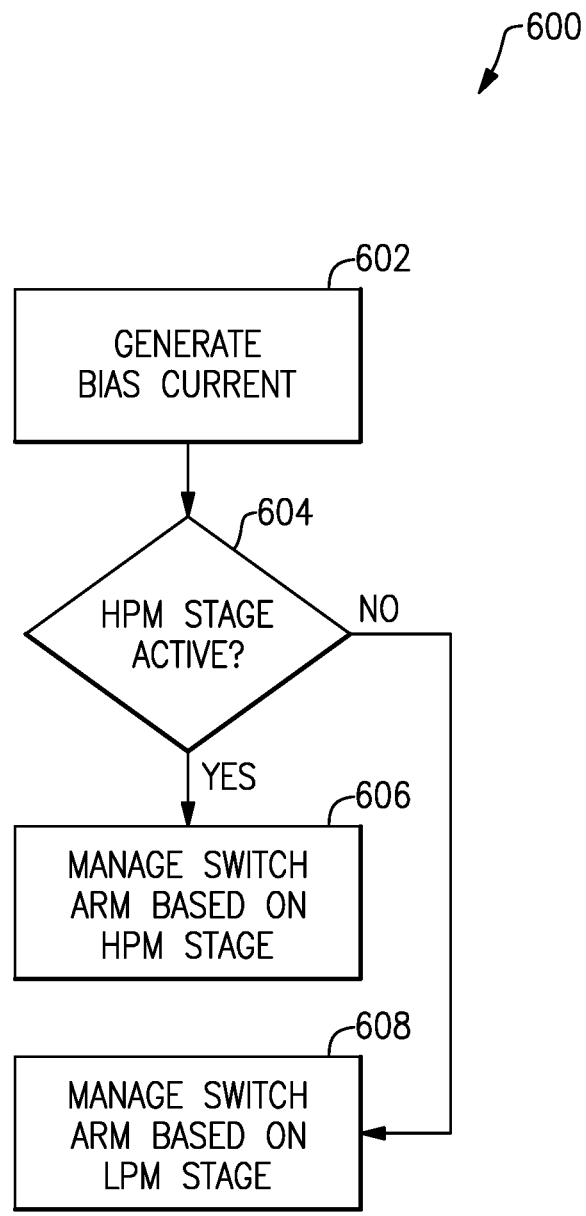
FIG. 6 shows a process for limiting average current values at a power amplifier that can be implemented with embodiments herein.

FIG. 6 shows a process 600 for limiting average current values at a power amplifier that can be implemented with embodiments herein. Steps of the process 600 may be performed in any order and in some cases steps may be removed and/or added as needed.

In block 602, a bias current may be generated. In some embodiments, the bias current may be fed through a switch to allow the bias current to flow through either a HPM stage or a LPM stage of a power amplifier.

In decision block 604, it may be determined whether the bias current flows through the HPM stage or the LPM stage. If the bias current flows through the HPM stage, the HPM stage may be active and the process 600 continues to block 606. If the bias current flows through the LPM stage, the LPM stage may be active and the process 602 continues to block 608.

In block 606, a switch arm at a band switch may be controlled/managed based on the HPM stage. In some embodiments, the switch arm may be connected to the HPM stage at a collector of a common-base transistor of the HPM stage.

In block 608, the switch arm may be controlled/managed based on the LPM stage. In some embodiments, the switch arm may be connected to the LPM stage at a collector of a common-base transistor of the LPM stage.

Figure 7:
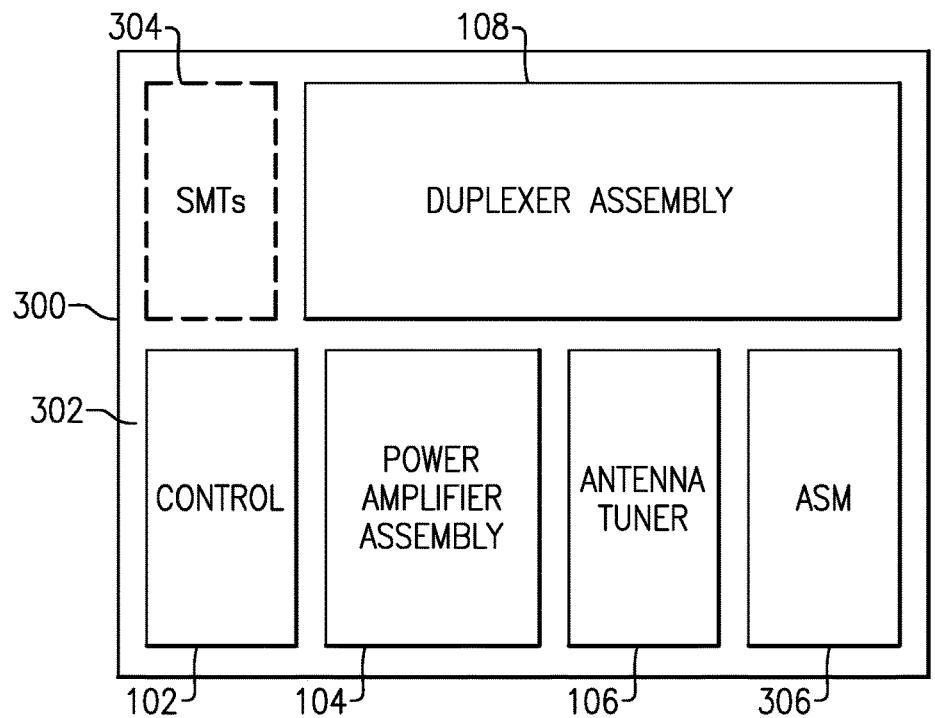
FIG. 7 shows a module including some or all of a front-end architecture having one or more features as described herein.

FIG. 7 shows that in some embodiments, some or all of a front-end architecture having one or more features as described herein can be implemented in a module. Such a module can be, for example, a front-end module (FEM). In the example of FIG. 7, a module 300 can include a packaging substrate 302, and a number of components can be mounted on such a packaging substrate. For example, a control component 102, a power amplifier assembly 104, an antenna tuner component 106, and a duplexer assembly 108 can be mounted and/or implemented on and/or within the packaging substrate 302. Other components such as a number of SMT devices 304 and an antenna switch module (ASM) 306 can also be mounted on the packaging substrate 302. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 8:
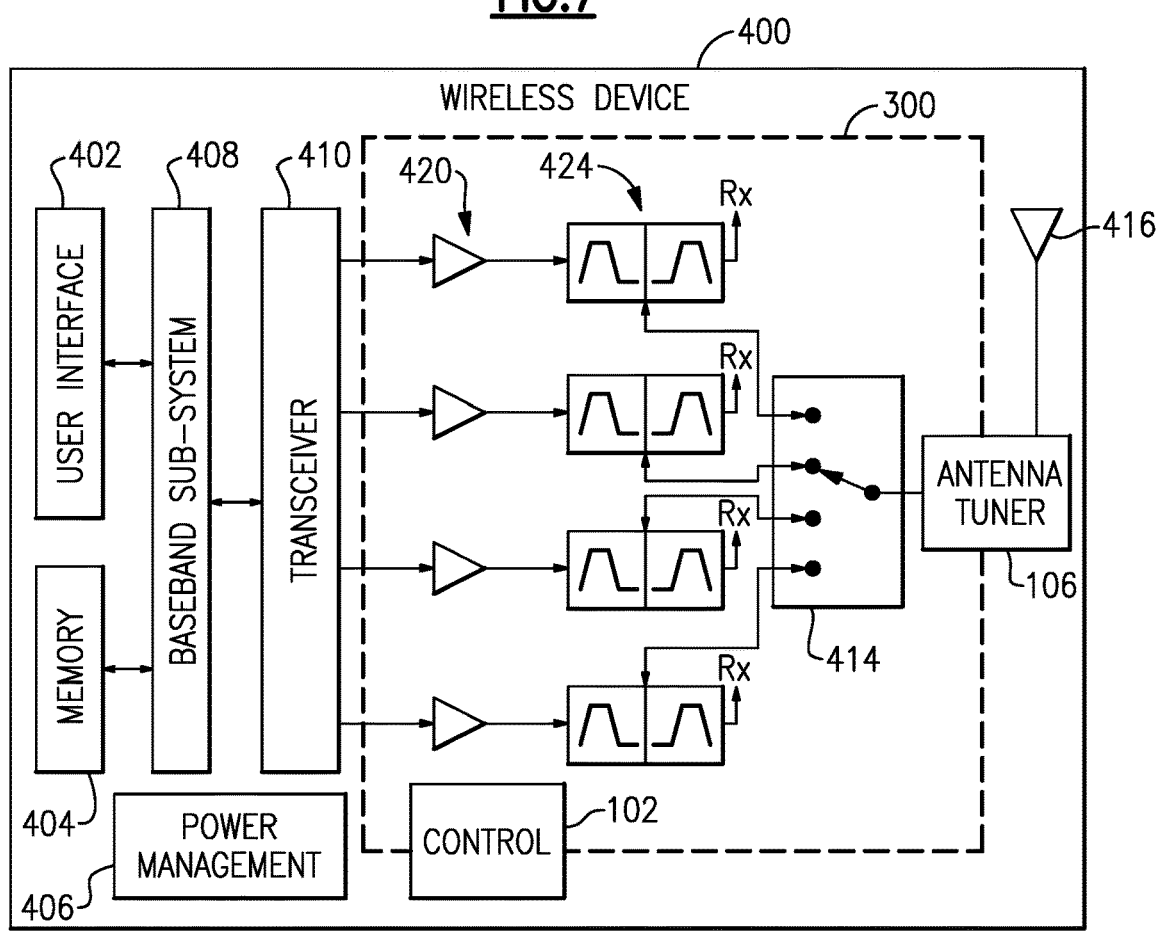
FIG. 8 depicts an example wireless device having one or more advantageous features described herein.

FIG. 8 depicts an example wireless device 400 having one or more advantageous features described herein. In the context of a module having one or more features as described herein, such a module can be generally depicted by a dashed box 300, and can be implemented as, for example, a front-end module (FEM).

Referring to FIG. 8, power amplifiers 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410.

The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the power amplifiers 420 are shown to be routed to their respective duplexers 420. Such amplified and filtered signals can be routed to an antenna 416 through an antenna switch 414 for transmission. In some embodiments, the duplexers 420 can allow transmit and receive operations to be performed simultaneously using a common antenna (e.g., 416). In FIG. 8, received signals are shown to be routed to "Rx" paths (not shown) that can include, for example, a low-noise amplifier (LNA).

As described herein, one or more features of the present disclosure can provide a number of advantages when implemented in systems such as those involving the wireless device of FIG. 8. For example, a controller 102, which may or may not be part of the module 300, can monitor base currents associated with at least some of the power amplifiers 420. Based on such monitored base currents, an antenna tuner 106 (which may or may not be part of the module 300), can be adjusted to provide a desired impedance to the corresponding power amplifier.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
   a current source;
   an input switch configured to alternatively feed current from the current source to a high-power circuit path and a low-power circuit path, the high-power circuit path including a first transistor including a first collector, a first emitter, and a first base, a second transistor including a second collector, a second emitter, and a second base, and a third transistor including a third collector, a third emitter, and a third base, the first base being coupled to the third base, the second collector being coupled to the third emitter; and
   a band switch including a switch arm for switching between a plurality of bands, each of the first collector, the third collector, and the low-power circuit path being connected to the switch arm.

2. The power amplification system of claim 1, wherein the low-power circuit path includes a fourth transistor, the fourth transistor including a fourth collector, a fourth emitter, and a fourth base.

3. The power amplification system of claim 2, wherein the first emitter is connected to the fourth collector.

4. The power amplification system of claim 2, wherein the first transistor is a common-base transistor and the fourth transistor is a common-emitter transistor.

5. The power amplification system of claim 2, wherein the fourth base is connected to the input switch.

6. The power amplification system of claim 1, wherein the first collector is connected to the third collector at a node, and wherein the node is connected to the switch arm.

7. The power amplification system of claim 1, wherein the third transistor is a common-base transistor and the second transistor is a common-emitter transistor.

8. The power amplification system of claim 1, wherein the second base is connected to the input switch via a fourth transistor.

9. A method comprising:
  alternatively providing current, at an input switch, from a current source to a high-power circuit path or a low-power circuit path, the high-power circuit path including a first transistor including a first collector, a first emitter, and a first base, a second transistor including a second collector, a second emitter, and a second base, and a third transistor including a third collector, a third emitter, and a third base, the first base being coupled to the third base, the second collector being coupled to the third emitter; and
  switching a switch arm of a band switch between a plurality of bands based on the current provided to the high-power circuit path or the low-power circuit path, each of the first collector, the third collector, and the low-power circuit path being connected to the switch arm.

10. The method of claim 9, wherein the low-power circuit path includes a fourth transistor, the fourth transistor including a fourth collector, a fourth emitter, and a fourth base.

11. The method of claim 10, wherein the first emitter is connected to the fourth collector.

12. The method of claim 10, wherein the first transistor is a common-base transistor and the fourth transistor is a common-emitter transistor.

13. The method of claim 10, wherein the fourth base is connected to the input switch.

14. A circuit comprising:
  a current source;
  an input switch configured to alternatively feed current from the current source to a high-power circuit path and a low-power circuit path, the high-power circuit path including a first transistor including a first collector, a first emitter, and a first base, a second transistor including a second collector, a second emitter, and a second base, and a third transistor including a third collector, a third emitter, and a third base, the first base being coupled to the third base, the second collector being coupled to the third emitter; and
  a band switch including a switch arm for switching between a plurality of bands, each of the first collector, the third collector, and the low-power circuit path being connected to the switch arm.

* * * * *